United States Patent
Akel et al.

(10) Patent No.: US 11,869,589 B2
(45) Date of Patent: *Jan. 9, 2024

(54) CONTENT ADDRESSABLE MEMORY SYSTEMS WITH CONTENT ADDRESSABLE MEMORY BUFFERS

(71) Applicant: Micron Technology, Inc., Boise, ID (US)

(72) Inventors: Ameen D. Akel, Rancho Cordova, CA (US); Sean S. Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 361 days.

This patent is subject to a terminal disclaimer.

(21) Appl. No.: 17/188,843

(22) Filed: Mar. 1, 2021

(65) Prior Publication Data
US 2021/0225447 A1   Jul. 22, 2021

Related U.S. Application Data

(63) Continuation of application No. 16/382,449, filed on Apr. 12, 2019, now Pat. No. 10,937,499.

(51) Int. Cl.
*G11C 15/04*   (2006.01)

(52) U.S. Cl.
CPC .................. *G11C 15/046* (2013.01)

(58) Field of Classification Search
CPC ........ G11C 15/046; G11C 15/02; G11C 15/04
USPC ....................................... 365/49.11
See application file for complete search history.

(56) References Cited

U.S. PATENT DOCUMENTS

| | | |
|---|---|---|
| 5,596,686 A | 1/1997 | Duluk |
| 6,219,748 B1 | 4/2001 | Srinivasan et al. |
| 6,229,742 B1 | 5/2001 | Srinivasan et al. |
| 6,263,404 B1 | 7/2001 | Borkenhagen et al. |
| 6,385,697 B1 | 5/2002 | Miyazaki |
| 6,933,757 B1 | 8/2005 | Sywyk |

(Continued)

FOREIGN PATENT DOCUMENTS

JP   2004-086934 A   3/2004

OTHER PUBLICATIONS

U.S. Appl. No. 15/827,019, entitled "Comparing Input Data to Stored Data," filed Nov. 30, 2017, 77 pages.

(Continued)

*Primary Examiner* — Connie C Yoha
(74) *Attorney, Agent, or Firm* — Brooks, Cameron & Huebsch, PLLC (57) ABSTRACT

An apparatus (e.g., a content addressable memory system) can have a controller; a first content addressable memory coupled to the controller and a second content addressable memory coupled to the controller. The controller can be configured to cause the first content addressable memory to compare input data to first data stored in the first content addressable memory and cause the second content addressable memory to compare the input data to second data stored in the second content addressable memory such the input data is compared to the first and second data concurrently and replace a result of the comparison of the input data to the first data with a result of the comparison of the input data to the second data in response to determining that the first data is invalid and that the second data corresponds to the first data.

18 Claims, 7 Drawing Sheets

(56) References Cited

U.S. PATENT DOCUMENTS

| | | | |
|---|---|---|---|
| 6,958,925 | B1 | 10/2005 | Om |
| 7,170,776 | B2 | 1/2007 | Ooishi |
| 7,675,765 | B2 | 3/2010 | Derhacobian et al. |
| 8,982,596 | B1 | 3/2015 | Srinivasan |
| 10,067,705 | B2 | 9/2018 | Abali |
| 10,937,499 | B2 * | 3/2021 | Akel ................. G11C 15/04 |
| 2003/0090938 | A1 | 5/2003 | Taura et al. |
| 2006/0018227 | A1 * | 1/2006 | Nakajima .......... G06F 12/0246 369/53.2 |
| 2007/0113001 | A1 * | 5/2007 | Yamada ............. G06F 12/0246 711/E12.008 |
| 2010/0250843 | A1 | 9/2010 | Eilert |
| 2010/0328981 | A1 | 12/2010 | Deshpande et al. |
| 2013/0054886 | A1 | 2/2013 | Eshraghian et al. |
| 2015/0085577 | A1 | 3/2015 | Suzuki |
| 2015/0199233 | A1 * | 7/2015 | Pelley ................. G06F 11/1076 714/764 |
| 2015/0242269 | A1 | 8/2015 | Pelley |
| 2020/0210330 | A1 * | 7/2020 | Muchherla .......... G06F 12/0238 |

OTHER PUBLICATIONS

U.S. Appl. No. 15/827,119, entitled "Operations on Memory Cells," filed Nov. 30, 2017, 76 pages.
International Search Report and Written Opinion from related International Application No. PCT/US2020/026096, dated Jul. 17, 2020, 12 pages.

* cited by examiner

CONTENT ADDRESSABLE MEMORY SYSTEMS WITH CONTENT ADDRESSABLE MEMORY BUFFERS

PRIORITY INFORMATION

This application is a Continuation of U.S. application Ser. No. 16/382,449 filed on Apr. 12, 2019, and will issue as U.S. Pat. No. 10,937,499 on Mar. 2, 2021, the contents of which are incorporated herein by reference.

TECHNICAL FIELD

The present disclosure relates generally to content addressable memories, and, more particularly, to content addressable memory systems with content addressable memory buffers.

BACKGROUND

Memory systems may be implemented in electronic systems, such as computers, cell phones, hand-held electronic devices, etc. Some memory systems, such as solid-state drives (SSDs), embedded Multi-Media Controller (eMMC) devices, Universal Flash Storage (UFS) devices, and the like, may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three-dimensional cross-point memory (e.g., 3D XPoint), resistive random access memory (RRAM), ferroelectric random access memory (FeRAM), magnetoresistive random access memory (MRAM), and programmable conductive memory, among other types of memory.

Some memory cells, such as various resistance variable memory cells, can be arranged in cross-point architectures such that the memory cells are located at intersections of signal lines used to access the cells (e.g., at intersections of word lines and bit lines). The state (e.g., stored data value) of a resistance variable memory cell can depend on the programmed resistance of the memory cell, for example.

In some examples, the resistance of the memory cell can be programmed to a low threshold voltage (Vt) state (e.g., a "set" state) or a high Vt state (e.g., a "reset" state). The state of (e.g., the data value stored by) a resistance variable memory cell can be determined by, for example, determining whether the cell changes its conductive state (e.g., experiences a switching event) in response to applying a sensing voltage, which may be referred to as a read voltage or a demarcation voltage, to (e.g., across) the cell. For example, the demarcation voltage can be selected to lie in a margin between the Vt (e.g., a Vt distribution) corresponding to the reset state and the Vt (e.g., a Vt distribution) corresponding to the set state.

Memories typically return user data to the host (e.g., during a read operation) in response to an address supplied by the host. Another form of memory is content addressable memory (CAM), also known as associative pattern memory (APM). In some examples, a CAM may receive input data (e.g., an input data vector) and may perform a search to determine if the input data is stored in the CAM. For example, a CAM may determine whether the stored data (e.g., stored data vectors) in the CAM match the input data. CAM can be utilized as a hardware-based search device in applications that require fast searches or pattern matching, such as in computer systems, databases, image or voice recognition, biometrics, data compression, cache memory controllers, or computer and communication networks (e.g., in network switches, media access controllers, network routers, etc.).

DETAILED DESCRIPTION

In various instances, a non-volatile memory can be used as a CAM. Providing non-volatile memory CAMs can have various benefits over volatile CAMs (e.g., SRAM CAMs). For instance, a non-volatile CAM does not require power to maintain its data, and non-volatile memory cells often have a smaller footprint as compared to volatile memory cells and so can provide a greater storage density. However, often times volatile CAMs can provide faster access times (e.g., read/write times) as compared to non-volatile CAMs.

In some instances, the data stored in some resistance variable memory cells, such as chalcogenide-based memory cells, might not be valid (e.g., reliable), immediately after the memory cells are programmed (e.g., written). As such, it might not be possible to reliably read such memory cells immediately after they are programmed. For example, as discussed further herein, it might be necessary to allow such memory cells to drift for a threshold length of time (e.g., about one millisecond) after they are programmed before they can be read reliably, and thus the data stored by the memory cells is valid. Therefore, the speed at which CAMs employing such resistance variable memory cells can be accessed can be limited by the threshold length of time.

As described further herein, various embodiments of the present disclosure provide CAM implementations that can account for the fact that data written in some resistance variable non-volatile memory cells can be invalid immediately after the data is written. Accordingly, embodiments can provide non-volatile CAMs having improved access times as compared to previous approaches, among other benefits. As an example, a number of embodiments can employ a non-volatile first CAM as a main CAM and second CAM as a buffer CAM, such as a volatile CAM (e.g., an SRAM buffer CAM). For example, the data stored in such volatile CAMs can be valid as soon as the data is written, and thus the data can be compared reliably to input data as soon as the data is written.

In some examples, the input data can be compared to data stored in the main CAM and data stored in the buffer CAM concurrently. The result of the comparison of the input data to the data in the main CAM can be replaced by the result of the comparison of the input data to the data in the buffer CAM in response to determining that the data stored in the main CAM is invalid (unreliable), for example, in response to determining that the result of the comparison of the input data to the data in the main CAM is invalid. For example, the data in the main CAM, and thus the result of the comparison of the input data to the data in the main CAM, can be invalid when an elapsed time from a time when the data is written in the first content addressable memory to a time when the input data is compared to the data in the first content addressable memory is less than the threshold length of time. Note, for example, the threshold length of time can be an elapsed time from the time when the data is written in the first content addressable memory to a time when the data in the main CAM become valid, and thus the result of the comparison of the input data to the data written in the first content addressable memory becomes valid. A buffer CAM in conjunction with the main non-volatile CAM can eliminate, for example, the delays associated with waiting until results of comparisons of the input data to the data in non-volatile CAMs are valid.

Using a buffer CAM buffer in conjunction with the main non-volatile CAM can reduce the energy requirements, costs, and the time it takes to obtain reliable comparison results compared to using a DRAM buffer or a table as a buffer in conjunction with the main CAM. For example, using a DRAM or a table can involve the time-consuming process of scanning the entire content of the DRAM or the table to identify the data corresponding to the data in the main CAM being compared to the input data.

Figure 1A:
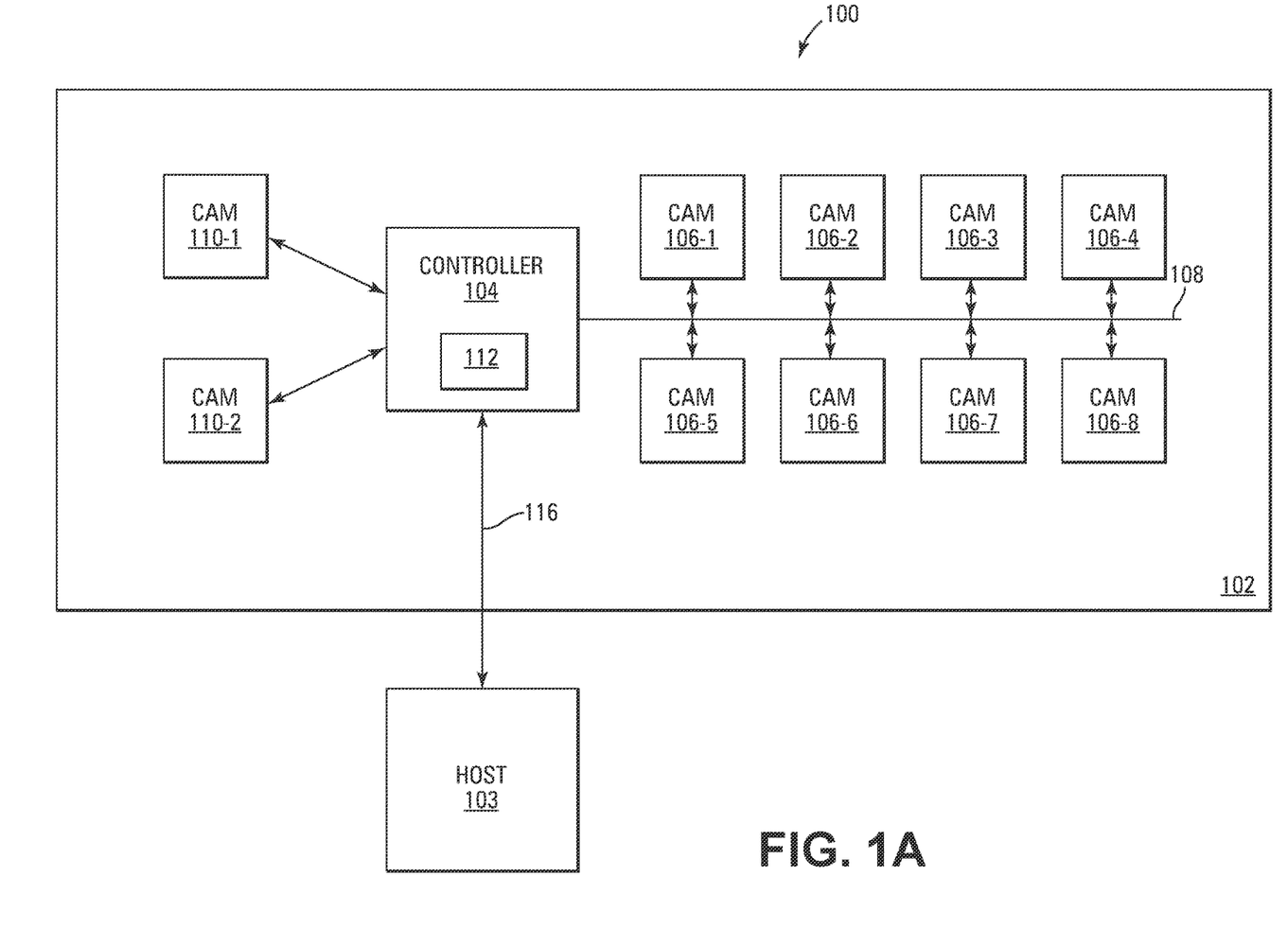
FIG. 1A is a simplified block diagram of an apparatus in accordance with a number of embodiments of the present disclosure.

FIG. 1A is a simplified block diagram of an apparatus in the form of a computing system 100 in accordance with a number of embodiments of the present disclosure. Computing system 100 includes an apparatus in the form of CAM system 102 that can be, for example, a peripheral component interconnect express (PCIe) CAM system.

CAM system 102 can include a controller 104, CAMs 106-1 to 106-8 coupled to controller 104 over a bus 108, and CAMs 110-1 and 110-2 coupled to controller 104. Although eight CAMs 106 and two CAMs 110 are shown, there can be any number of CAMs 106 and CAMs 110. In some examples, CAMs 106 can be referred to as main (e.g., primary) CAMs, and CAMs 110 can be referred to as buffer CAMs (e.g., because CAMs 110 can act as buffers for CAMs 106). In some examples, there can be a single main CAM 106 that can include CAMs 106-1 to 106-8, and there can be a single buffer CAM 110 that can include CAMs 110-1 and 110-2. Herein, "CAM 106" and/or "main CAM" will be used to refer to one or more of CAMs 106-1 to 106-8, and "CAM 110" and/or "buffer CAM" will be used to refer to one or more of CAMs 110-1 and 110-2.

Controller 104 can cause CAM 106 to compare input data, such as an input data vector, (e.g., from a host 103) to stored data, such as a stored data vector, stored in CAM 106, and can cause CAM 110 to compare the input data to data stored in CAM 110 such that the input data is compared to data stored in CAMs 106 and 110 concurrently. Controller 104 can replace a result of the comparison of the input data to the data stored in CAM 106 with a result of the comparison of the input data to the data stored in CAM 110 in response to determining that the data stored in CAM 106 is invalid, and thus that the result of the comparison of the input data to the data stored in CAM 106 is invalid, and, for example, that the data stored in CAM 110 corresponds to the data stored in CAM 106.

Controller 104 can determine that the data stored in CAM 106 is invalid by determining that an elapsed time from a time when the data is written in CAM 106 to a time when the input data is compared to the data in CAM 106 is less than the threshold length of time. Note, for example, the threshold length of time, can be an elapsed time from the time when the data is written in CAM 106 to a time when the data written in CAM 106 becomes valid.

In some examples, CAM 106 can be a non-volatile CAM and CAM 110 can be a volatile CAM, such as an SRAM CAM. For example, the data stored in CAM 110 can be stored SRAM memory cells, and the data stored CAM 106 can be stored in non-volatile memory cells. The data stored in CAM 106 can drift from when the data is programmed in CAM 106, for example. In some examples, CAM 106 can be a cross-point device, such as a 3D XPoint device, that can include memory cells that can drift, such as resistance variable memory cells.

In various examples, controller 104 can include match validation circuitry that can be used to validate a match between the input data vector and a data vector stored in the buffer CAM (e.g., CAM 110) or the main CAM (e.g., CAM 106). For example, in response to receiving an indication that the input data vector matches a stored data vector, the match validation circuitry can cause the buffer CAM or the main CAM to read the stored data vector and return the data vector read from the buffer CAM or the main CAM to controller 104. The match validation circuitry can then compare the returned the data vector to the input data vector to determine whether the previously indicated match is valid.

In some examples, the main CAM and the buffer CAM can include match validation circuitry that can be used to validate a match between the input data vector and a stored vector. For example, in response the input data vector matching the stored data vector, the match validation circuitry can read the stored data vector and compare the read data vector to the input data vector to determine whether the previously indicated match is valid. If the match is invalid, the match validation circuitry can change the result of the comparison from a match to a mismatch and send the result to controller 104. In various examples in which the match validation circuitry in the main CAM determines the match between the input data and the stored data vector to be invalid, controller 104 might increase the threshold length of time.

Figure 1B:
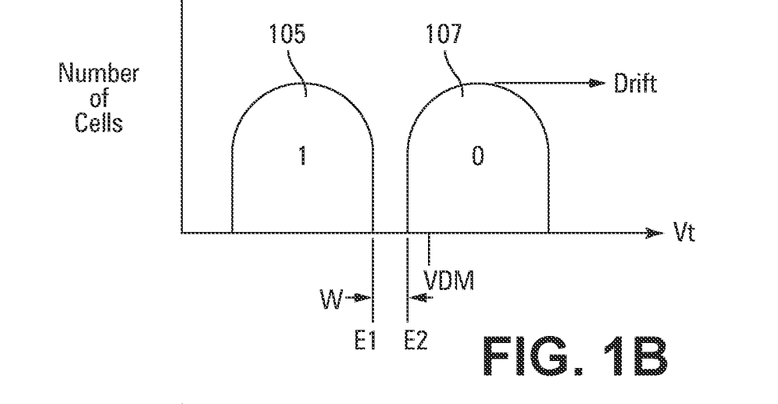
FIG. 1B illustrates an example of threshold voltage distributions for non-volatile memory cells immediately after programming in accordance with a number of embodiments of the present disclosure.
Figure 1C:
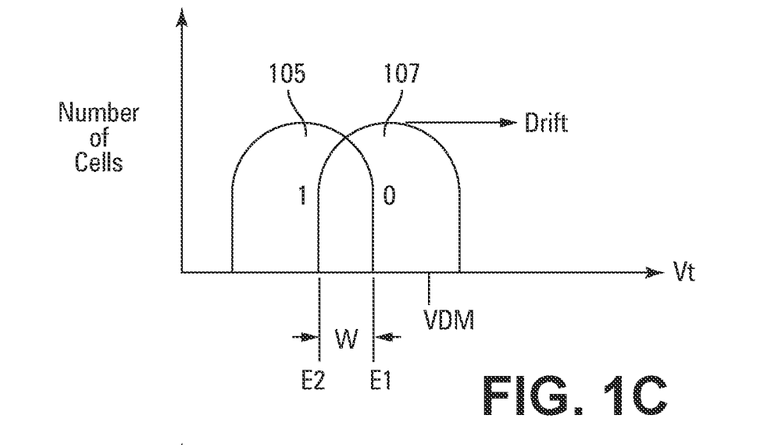
FIG. 1C illustrates another example of threshold voltage distributions for non-volatile memory cells immediately after programming in accordance with a number of embodiments of the present disclosure.
Figure 1D:
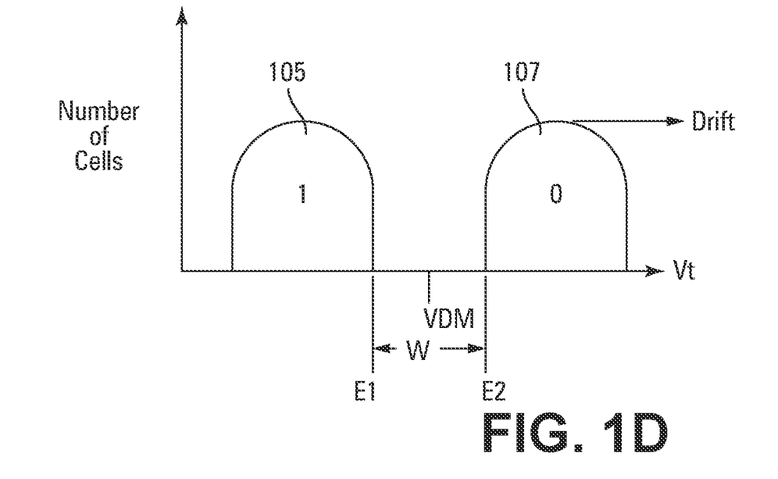
FIG. 1D illustrates an example of threshold voltage distributions for non-volatile memory cells after a threshold length of time after programming in accordance with a number of embodiments of the present disclosure.

FIG. 1B illustrates an example of Vt distributions for non-volatile memory cells immediately after programming (writing) in accordance with a number of embodiments of the present disclosure. FIG. 1C illustrates another example of Vt distributions for non-volatile memory cells immediately after programming in accordance with a number of embodiments of the present disclosure. FIG. 1D illustrates an example of Vt distributions for non-volatile memory cells after a threshold length of time after programming in accordance with a number of embodiments of the present disclosure.

In the examples of FIGS. 1B to 1D, Vt distribution 105 can be referred to as the set state, and Vt distribution 107 can be referred to as the reset state. In the examples of FIGS. 1B to 1D, Vt distribution 105 corresponds to memory cells programmed to store a data value of logic 1, and Vt distribution 107 corresponds to memory cells programmed to store a data value of logic 0. However, embodiments are not limited to this assigned encoding. Note that the examples of FIGS. 1B to 1D depict programming memory cells from the set state to the reset state.

In the examples of FIGS. 1B to 1D, an edge voltage E1 can be defined as the Vt corresponding the upper edge of distribution 105, and an edge voltage E2 can be defined as the Vt corresponding the lower edge of distribution 107. A margin (e.g., a window) W is the difference between E2 and E1. For example, W=E2−E1. In the examples of FIGS. 1B to 1D, VDM represents a demarcation voltage that can be used to determine the stored states of (e.g., the data values stored by) the memory cells (e.g., "1" or "0"). In some examples, VDM can correspond to an input data value to be compared to the data values stored by the memory cells. Demarcation voltage VDM can be selected to lie in the margin W, as shown in FIG. 1D.

In some instances, when various non-volatile memory cells, such as some resistance variable memory cells, are programmed from the set state, for example, to the reset state, the data in the memory cells might not be valid immediately after programming, This is because the margin W can be inadequate for VDM to reliably differentiate between the set state and the reset state immediately after programming, as shown in FIGS. 1B and 1C.

In some instances, the margin W can be too small for VDM to lie in the margin W, immediately after programming, as shown in FIG. 1B. For example, VDM lies outside of the margin W and inside Vt distribution 107. In some instances, the Vt distributions corresponding to the set and reset states can actually overlap, as shown in FIG. 1C. For example, the margin W in FIG. 1C is negative because edge voltage E1 is greater than the edge voltage E2. Note that, as in the example of FIG. 1B, VDM lies inside Vt distribution 107 in FIG. 1C.

Applying VDM to the memory cells immediately after programming, as shown in FIGS. 1B and 1C, can generate an invalid result. In the examples, of FIGS. 1B and 1C, for example, the memory cells in distribution 107 having Vts less than VDM might be determined to store a data value of 1 in response to applying VDM, and the memory cells in Vt distribution 107 having Vts greater than VDM might be determined to store a data value of 0. As such, the data stored in the memory cells in FIGS. 1B and 1C can be invalid.

However, the Vts of some resistance variable memory cells can drift (e.g., to a higher absolute value) over time after they are programmed to the reset state, for example. As the Vts drift, the reset Vt distribution can move away from set Vt distribution, as indicated by the arrows in FIGS. 1B and 1C, increasing the margin W. When the margin W has increased to a point at which demarcation voltage lies in the margin without lying in either Vt distribution 105 or Vt distribution 107, as shown in FIG. 1D, for example, the results of reading the memory cells with VDM can be (e.g., determined to be) valid. As such, the data stored in the memory cells in FIG. 1D can be valid. For example, comparisons of input data having a data value corresponding to VDM to data stored in the memory cells, and thus the results of those comparisons, can be determined to be valid for the situation depicted in FIG. 1D, but invalid for the situations depicted in FIGS. 1B and 1C.

In some examples, the elapsed time from the time at which (e.g., when) the memory cells are programmed to the time when the data stored in the memory cells becomes valid can be the threshold length of time referred to herein. For example, FIG. 1D can correspond to an elapsed time, from when the memory cells were programmed, that might be greater than or equal to the threshold length of time. The time at which the memory cells are (e.g., a data vector is) programmed can be the time at which a programming voltage is applied to or removed from the memory cells, for example. In some examples, the threshold length of time can be about one millisecond.

The data stored in the non-volatile memory cells can be invalid for an elapsed time from a time at which data is written that is less than the threshold length of time and valid for an elapsed time from the time at which data is written that is greater than or equal to the threshold length of time. As such, in some examples, comparisons of input data to data stored in the non-volatile memory cells, and thus the results of those comparisons, can be determined to be invalid for an elapsed time from a time at which data is written to a time at which the input data is compared to the data that is less than the threshold length of time and valid for an elapsed time from the time at which data is written to the time at which the input data is compared to the data that is greater than or equal to the threshold length of time.

In the examples of FIGS. 1B to 1D, the Vts corresponding to the set and reset state and the VDM are positive, with the Vts corresponding to the reset state being greater, in the positive sense, than the Vts corresponding to the set state and the drift acting to increase the Vts in the positive sense. However, the Vts corresponding to the set and reset state and the VDM can be negative, with the Vts corresponding to the reset state being greater, the negative sense, than the Vts corresponding to the set state and the drift acting to increase the Vts in the negative sense.

For at least the reasons just described, the comparisons between input data and data stored in the memory cells in CAM 106 can be invalid at least for times less than the threshold length of time. However, the data stored in CAM 110 can be valid as soon as it is written. This is why the results of comparing input data to data stored in CAM 110 can be used in place of the results of comparing the input data to data stored in CAM 106 during the threshold length of time when the data in CAM 106 are invalid.

In some examples, controller 104 can determine whether the data stored in CAM 10 is valid by reading the data from CAM 106, comparing the read data to data intended to be programmed in CAM 106, for example, by comparing the read data to corresponding data in CAM 110, and determining whether the read data matches the data intended to be programmed in the non-volatile memory cells. For example, controller 104 can determine that the read data is valid in response to determining that the read data matches the data intended to be programmed in CAM 106 and can determine that the read data is invalid in response to determining that the read data mismatches the data intended to be programmed in CAM 106. Note that controller 104 can determine that the comparison of the input data to the data stored in CAM 106 is valid by determining that the data stored in CAM 106 is valid and that the comparison of the input data to the data stored in CAM 106 is invalid by determining that the data stored in CAM 106 is invalid.

In some examples, controller 104 can determine whether a result of a comparison of an input data vector to a data vector in CAM 106 is valid, and thus whether data vector in CAM 106 is valid, by comparing the result to a result of a comparison of the input data vector to a data vector in CAM 110 that corresponds to the data vector in CAM 106. If the results match, then the result of the comparison of the input data vector to the data vector in CAM 106, and thus the data vector in CAM 106, is valid. If the results mismatch, then the result of the comparison of the input data vector to the data vector in CAM 106, and thus the data vector in CAM 106, is invalid.

In some examples, controller 104 can cause main CAM 106 to write data vectors in main CAM 106 and buffer CAM 110 concurrently. Controller 104 can create a data structure, such as a lookup (e.g., mapping) table 112 (e.g., in controller 104) each time data vectors are concurrently written in the main CAM and the buffer CAM (e.g., in response to the data vectors being written in the main CAM and the buffer CAM concurrently). In some examples, controller 104 can manage lookup table 112.

Figure 1E:
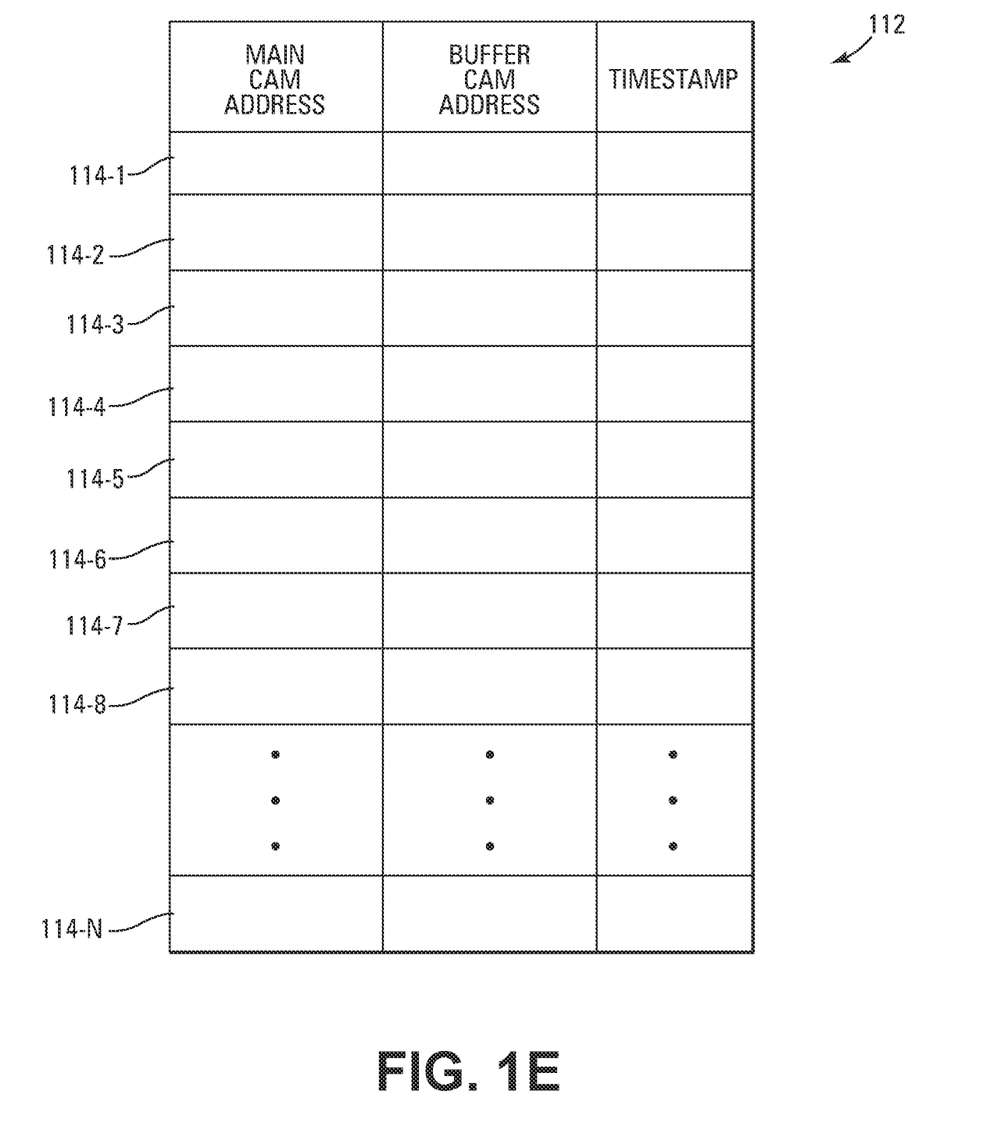
FIG. 1E illustrates an example of a data structure in accordance with a number of embodiments of the present disclosure.

FIG. 1E illustrates an example of a data structure in the form of lookup table 112 in accordance with a number of embodiments of the present disclosure. Lookup table 112 can include (e.g., an ordered sequence of) entries 114-1 to 114-N that can be used for mapping locations (e.g., addresses of locations) of data vectors in the main CAM to locations (e.g., addresses of locations) of corresponding data vectors in the buffer CAM during the time when the data vectors in the main CAM are invalid.

For example, locations of groups of memory cells in the main CAM storing the data vectors can be mapped to locations of groups of memory cells in the buffer CAM storing the data vectors. An entry 114 can include the address of the location (e.g., the address) of a data vector in the main CAM, the address of the corresponding data vector in the buffer CAM to which the address of the data vector in the main CAM is to be mapped, and a timestamp corresponding to the data vector in the main CAM specified in the entry 114. Note that the addresses of the data vectors in the main and buffer CAMs can be referred to as physical addresses.

The timestamp can be the time at which the data vector was programmed to the main CAM address specified in the entry 114. Controller 104 can manage lookup table 112, for example, by writing in an entry 114, the address of the data vector in the main CAM, the address of the data vector in the buffer CAM, and the time at which the data vector was programmed in the main CAM.

In some examples, the storage space in the buffer CAM can be sufficient to store all of the data vectors concurrently written to the buffer CAM and the main CAM. However, if the quantity of data vectors to be written in the main CAM exceeds the storage space in the buffer CAM, concurrent writing of data vectors in the main and buffer CAMs can be delayed until space becomes available in the buffer CAM. For example, controller 104 can delay the concurrent writing, in response to determining the buffer CAM is full, until a previously stored data vector in the buffer CAM is removed from the buffer CAM. Controller 104 can cause the buffer CAM to remove the previously stored data vector from the buffer CAM in response to determining that the previously stored data vector no longer corresponds to a data vector in the main CAM that is invalid.

Controller 104 can use lookup table 112 to determine whether data vectors in the main and buffer CAMs that are being compared to an input vector concurrently correspond to each other. In response to the main CAM and buffer CAM comparing an input data vector to a data vector in the main and buffer CAMs concurrently, controller 104 can determine whether there is an entry in lookup table 112 corresponding to the address of the data vector in the main CAM. If there is no entry, controller 104 can make the determination that the data vector in main CAM does not correspond to the data vector in the buffer CAM and/or that the data vector in main CAM is valid; for example, the result of comparing the data vector in the main CAM to an input data vector is valid. Therefore, controller 104 can use the result of the comparison of the input data vector to the data vector in the main CAM.

If there is an entry 114 in lookup table 112 corresponding to the address of the data vector the main CAM, controller 104 can make the determination that the data vector in the main CAM corresponds to the data vector in the buffer CAM whose address is in that entry 114 and can determine whether the data vector in the main CAM is valid from the timestamp in that entry 114.

For example, controller 104 can determine the elapsed time from the time specified in the timestamp to the time of the comparison. If the elapsed time is less than the threshold length of time, the data vector in the main CAM is invalid (e.g., for comparison), and the address of the data vector in the main CAM is mapped to the address of the data vector in the buffer CAM. For example, the result of the comparison of the input data vector to a data vector in the buffer CAM can be used in place of the result of the comparison of the input data vector to the data vector in the main CAM in response to determining that the data vector in the main CAM is invalid.

If the elapsed time, is greater than or equal to the threshold length of time, the data vector in the main CAM is valid. In some examples, controller 104 can remove the entry from lookup table 112, and thus invalidate the address mapping in the entry, in response to determining that the data vector having the address specified in the entry in valid. For example, the data vector in the buffer CAM corresponding to the data vector in the main CAM determined to be valid can be removed from the buffer CAM in response to determining that the data vector in the main CAM is valid. Note, for example, the threshold length of time can be predetermined and stored in controller 104.

In some examples, the timestamp can be the time at which the data vector in the main CAM becomes (e.g., is deemed to become) valid. For example, controller 104 can add the threshold length of time to the time at which the data vector is programmed in the main CAM address specified in the entry 114 to obtain the timestamp. Controller 104 can compare a time at which the entry is accessed to the timestamp. If the time is earlier (e.g., less) than the timestamp, the data vector in the main CAM, corresponding to the entry, is invalid. If the time is later (e.g., greater) than or equal to the timestamp, the data vector is valid.

Although the lookup table 112 in FIG. 1E includes a timestamp, the embodiments are not so limited, and the timestamp can be omitted, for example. For embodiments in which the timestamp is omitted, the number of entries in lookup table 112 can correspond to the number of data vectors that the main CAM can write in the threshold length of time. For example, a respective mapping can be written in a respective entry each time the buffer CAM and the main CAM concurrently write a data vector such that all N entries contain a mapping in the threshold length of time, and thus lookup table 112 is filled in the threshold length of time. This means that each mapping corresponds to a data vector written in the main CAM within the threshold length of time so that each mapping corresponds to an invalid data vector in the main CAM.

In some examples, lookup table 112 can be written in a circular manner (e.g., using a first-in-first-out (FIFO) method). For example, when lookup table 112 is full, the existing mappings can be overwritten with new mappings in the order in which the existing mappings were written so that the oldest mapping is overwritten (e.g., invalidated (removed)) first and so on. For example, because the N mappings in lookup table 112 correspond to N data vectors written in main CAM in the threshold length of time, the oldest mapping can be stored in lookup table 112 for at least the threshold length of time, and thus can be overwritten when the corresponding data vector in the main CAM is valid.

As such, each mapping can be overwritten when its corresponding data vector in the main CAM is valid. Therefore, controller 104 can determine that a data vector in the main CAM is invalid in response to finding a corresponding mapping in lookup table 112 absent the timestamp. For example, controller 104 can use the mapping to replace the result of the comparison of the input data vector to the data vector in the main CAM with the result of the comparison of the input data vector to the data vector in the buffer CAM. Controller 104 can also use the result of the comparison of the input data vector to various data vectors in the main CAM for which lookup table 112 does not have a mapping because those data vectors can be valid. For example, controller 104 can use the comparison of the input data vector to the data vector stored in the main CAM, corresponding to an overwritten mapping, in response to overwriting the mapping with a new mapping.

The buffer CAM can be sized to store a quantity of data vectors corresponding to that can be written in the main CAM in the threshold length of time so that the buffer CAM is filled with data vectors in threshold length of time. This means that each data vector in the buffer CAM corresponds to an invalid data vector in the main CAM.

In some examples, the buffer CAM can be written in a circular manner similar to that described in conjunction with lookup table 112. For example, when the buffer CAM is full, the existing data vectors can be overwritten with new data vectors in the order in which the existing data vectors were written so that the oldest data vector in the buffer CAM is overwritten (e.g., removed) first and so on. For example, because the data vectors are written in main CAM and buffer CAM concurrently in the threshold length of time, the oldest data vector can be stored the buffer CAM for at least the threshold length of time, and thus can be overwritten when the corresponding data vector in the main CAM is valid.

Controller 104 can replace the result of the comparison of the input data vector to the data vectors in the main CAM with the result of the comparison of the input data vector to corresponding data vectors in the buffer CAM as long as the corresponding vectors are in the buffer CAM. Controller 104 can also use the result of the comparison of the input data vector to various data vectors in the main CAM that are not in the buffer CAM because those data vectors can be valid. For example, controller 104 can use the comparison of the input data vector to the data vector stored in the main CAM, in response to overwriting the corresponding data vector in the buffer CAM with a new data vector.

In some examples, controller 104 can include a logical-to-physical (L2P) mapping table that can map a logical address, received from host 103, of a data vector to a physical address of the data vector in the main CAM.

Controller 104 can be a field programmable gate array (FPGA) and/or an application specific integrated circuit (ASIC), among other types of controllers. Host 103 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 103 can include one or more processors capable of accessing CAM system 102 (e.g., via controller 104) over an interface 116 that can include a bus. Interface 116 can be a standardized interface, such as a serial advanced technology attachment (SATA), PCIe, or a universal serial bus (USB), among various others.

In some examples, CAM system 102 can be part of a memory system of computing system 100. For example, the memory system can be a storage system, such as an SSD, a UFS device, an eMMC device, or the like. In various examples in which CAM system 102 can be part of the memory system, controller 104 can be a portion of (e.g., control logic integrated in) a memory system controller (e.g., an SSD controller, an application specific integrated circuit ASIC, a processor, or the like) coupled the memory system and configured to control various memory devices of the memory system.

Figure 2:
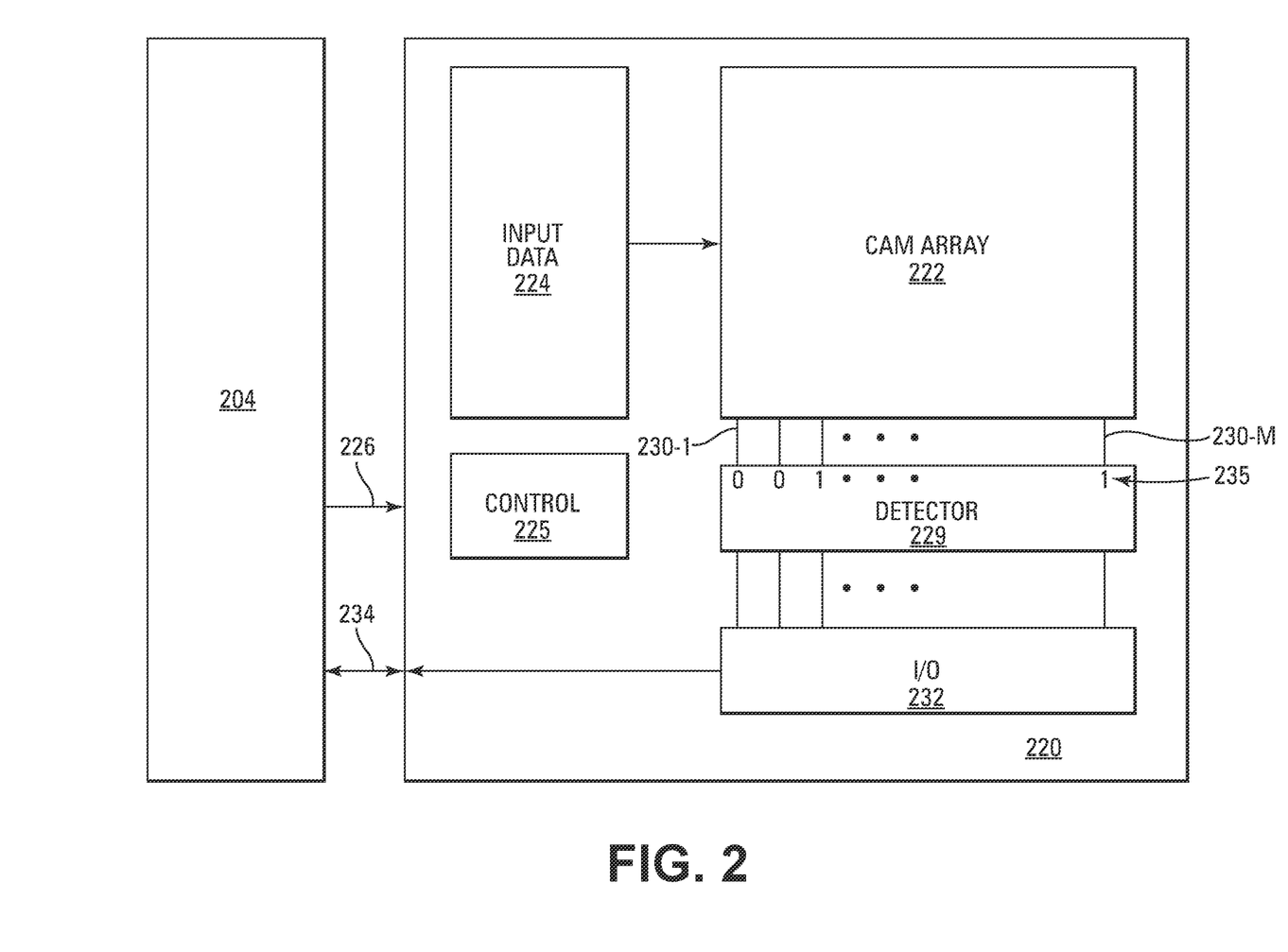
FIG. 2 is a simplified block diagram of a content addressable memory in accordance with a number of embodiments of the present disclosure.

FIG. 2 is a simplified block diagram of a CAM 220 in accordance with a number of embodiments of the present disclosure. For example, CAM 220 can be configured as a main CAM or a buffer CAM. CAM 220 includes a CAM array 222 that can be coupled to input data register 224. CAM array 222 can store data (e.g., in the form of stored data vectors), and input data register 224 can receive an input data vector from a controller 204 (e.g., that can be controller 104) to be compared to the stored data vectors. In examples in which CAM 220 is a buffer CAM, CAM array 222 can be SRAM memory array having SRAM cells. In examples in which CAM 220 is a main CAM, CAM array 222 can be a non-volatile memory array having non-volatile memory cells that can be invalid at least for times less than the threshold length of time, such as resistance variable memory cells (e.g., arranged in a cross-point fashion).

CAM 220 can have control circuitry 225 (e.g., a control state machine) that can direct the internal operation of CAM 220 and can manage CAM array 222. Control circuitry 225 can receive control signals from controller 204 over a control interface 226. For example, controller 204 can cause control circuitry 225 to compare the input data vector to the data vectors stored in CAM array 222 and can cause control circuitry 225 to write the data vectors in CAM array 222. In various examples, controller 225 can include the match validation circuitry described previously in conjunction with FIG. 1A.

A detector 229 can be coupled to CAM array 222 by lines 230-1 to 230-M (e.g., match lines). For example, each of the respective lines 230-1 to 230-M can correspond to a respective data vector stored in CAM array 222. In examples in which CAM 220 is a buffer CAM, the number of lines 230 can be equal to the number of entries 114 in lookup table 112.

Detector 229 can detect whether the stored data vectors match the input data vector and can generate a respective result (e.g., a data bit) for each respective stored data vector indicative of whether the respective stored data vector matches the input data vector. For example, as shown in FIG. 2, detector 229 might generate a data bit having a value of logical one (1) to indicate that a respective stored data vector matched the input data vector and a data bit having a value of logical zero (0) to indicate that a respective stored data vector did not match (e.g., mismatched) the input data vector. However, the disclosure is not so limited, and the roles of logical 1 and logical 0 can be reversed. In some examples, the results of the vector comparisons can be combined to form a result (e.g., an output) vector 235 having a component (e.g., a 1 or a 0) corresponding to each stored vector.

Detector 229 can be configured to associate (e.g., link) the address of each respective stored vector to a respective result in (e.g., a respective component of) result vector 235. In some examples, detector 229 can have sense amplifier (e.g., not shown in FIG. 2) coupled to each of lines 230-1 to 230-M. For example, each sense amplifier can be configured to generate a logical 1 or 0, depending on whether the sense amplifier detects a match or a mismatch. Result vector 235 and the associated addresses of the components can be sent to an input/output (I/O) buffer 232 for output to controller 204 over an interface 234. Note that in the context of FIG. 1A a result vector and the associated addresses of the components can be sent to controller 104 from the CAM 106 and the CAM 110 (e.g., concurrently).

Figure 3:
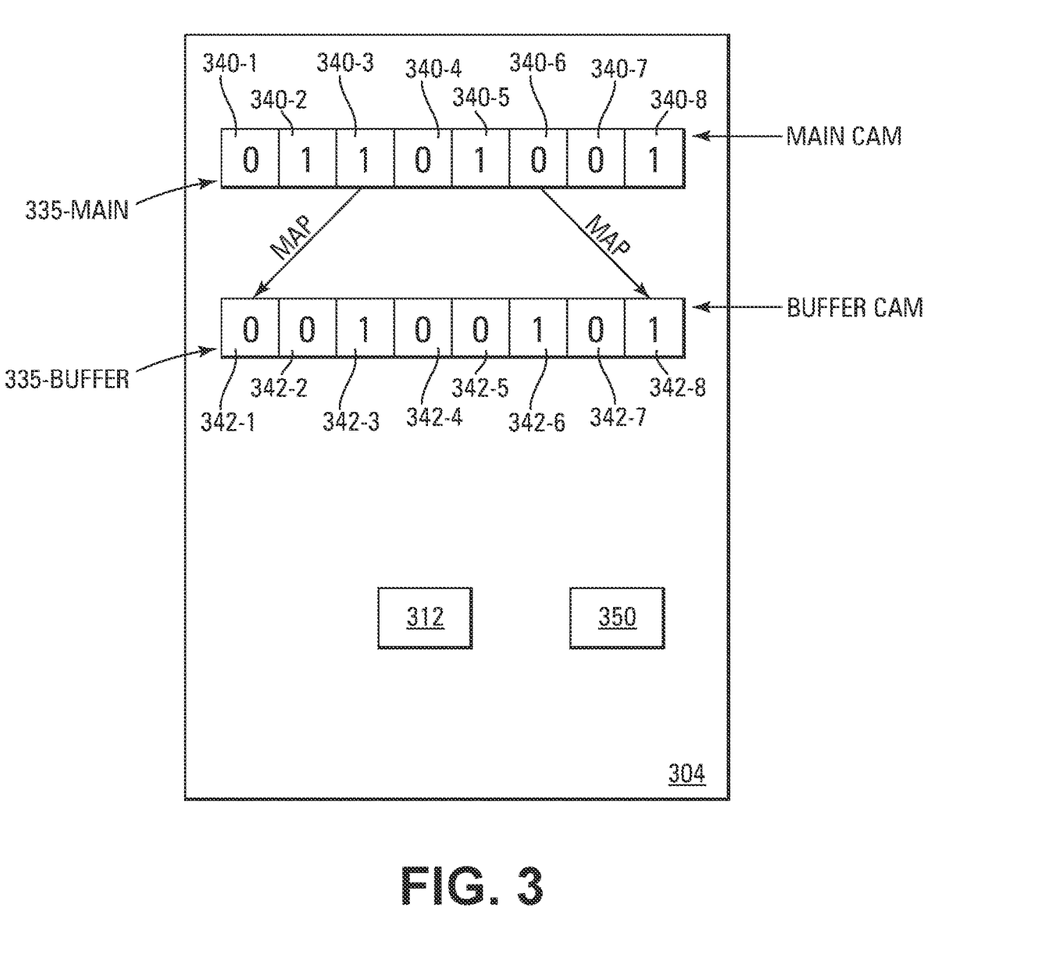
FIG. 3 illustrates result vectors received at a controller in accordance with a number of embodiments of the present disclosure.

FIG. 3 illustrates result vectors received at a controller 304 in accordance with a number of embodiments of the present disclosure. For example, controller 304 (e.g., that can be controller 104 or 204) can receive a result vector 335-Main from the main CAM and a result vector 335-Buffer from the buffer CAM concurrently. Result vector 335-Main has components (e.g., component data values 01101001) respectively associated with addresses 340-1 to 340-8, and result vector 335-Buffer has components (e.g., component data values 00100101) respectively associated with addresses 342-1 to 342-8. However, result vectors 335 are not limited to eight components and can have any quantity of components. Moreover, result vectors 335-Main and 335-Buffer can have different quantities of components. Controller 304 has a lookup table 312 (e.g., that can be lookup table 112).

Result vectors 335-Main and 335-Buffer can be generated concurrently in response to the main CAM comparing an input data vector to stored data vectors in the main CAM and the buffer CAM comparing the input data vector to stored data vectors in the buffer CAMs concurrently. For example, the stored data vectors in the main CAM can be respectively stored at locations in the main CAM respectively having the addresses 340-1 to 340-8, and the stored data vectors in the buffer CAM can be respectively stored at locations in the buffer CAM respectively having the addresses 342-1 to 342-8.

Upon receiving result vectors 335-Main and 335-Buffer, controller 304 can compare addresses 340-1 to 340-8 to the main CAM addresses in entries 114 lookup table 112. If any of the addresses 340-1 to 340-8 do not match the main CAM addresses in lookup table 112, then controller 304 can determine that the data vectors in the main CAM having those addresses are valid and can accept the results in the components in result vector 335-Main associated with those addresses as being valid. For example, addresses 340-2, 340-4, 340-5, and 340-7 might not match any of the main CAM addresses in lookup table 112, and the components in result vector 335-main associated with those address may be deemed valid.

Moreover, controller 304 can determine whether a data vector in the main CAM that has an address that matches a main CAM address in an entry in lookup table 112 is valid from the timestamp in that entry. For example, addresses 340-1, 340-3, 340-6, and 340-8 might respectively match main CAM addresses in entries 114-2, 114-4, 114-5, and 114-7. Controller 304 may then determine whether the data vectors in the main CAM having the addresses 340-1, 340-3, 340-6, and 340-8 are valid from the timestamps in entries 114-2, 114-4, 114-5, and 114-7, as described previously. For example, controller 304 might determine that the vectors having the addresses 340-1 and 340-8 are valid and might clear entries 114-2 and 114-7, thereby invalidating the mappings in those entries. Controller 304 might also remove the data vectors in the buffer CAM having the addresses 342-1 and 342-8, corresponding to addresses 340-1 and 340-8, from the buffer CAM in response to determining that the data vectors in the main CAM having the addresses 340-1 and 340-8 are valid.

However, controller 304 might determine that the vectors having the addresses 340-3 and 340-6 are invalid, and thus that the results (e.g., the logic 1 and the logic 0 respectively) in components of result vector 335-Main associated with addresses 340-3 and 340-6 are invalid. In an example, entries 114-4 and 114-5 might respectively map addresses 340-3 and 340-6 to the addresses 342-1 and 342-8 of data vectors in the buffer CAM, as shown in FIG. 3. The mapping results in a result data vector having the data components 01001101.

Note that addresses 340-1 to 340-8 and 342-1 to 342-8 can be physical addresses. Controller 304 can map respective physical addresses 340-1 to 340-8 to respective logical addresses using an L2P data structure, such as L2P mapping table 350, with addresses 340-3 and 340-6 respectively mapped to the addresses 342-1 and 342-8. Controller 304 can then associate the respective data components 01001101 of the result vector with the respective logical addresses and output the result vector with the associated logical addresses to host 103. In this way, controller 304 can indicate to host 103 which data vectors match the input data and which data vectors mismatch the data vector. For example, host 103 can determine, in logical address space from the logical addresses, which data vectors match the input data vector and which vectors mismatch the input data vector.

In some examples, controller 304 might indicate, to host 103, only the logical addresses corresponding to the vectors that matched the input data vector. For example, controller 304 might output the logical addresses mapped to components of the result vector having a logical 1 data value. Controller 304 might output, for example, the respective logical addresses mapped to physical addresses 340-2, 340-5, 340-6, and 340-8, noting that the address 340-3 is mapped to address 342-1 that is associated with a logical 0 and that the address 340-6 is mapped to address 342-8 that is associated with a logical 1.

Figure 4:
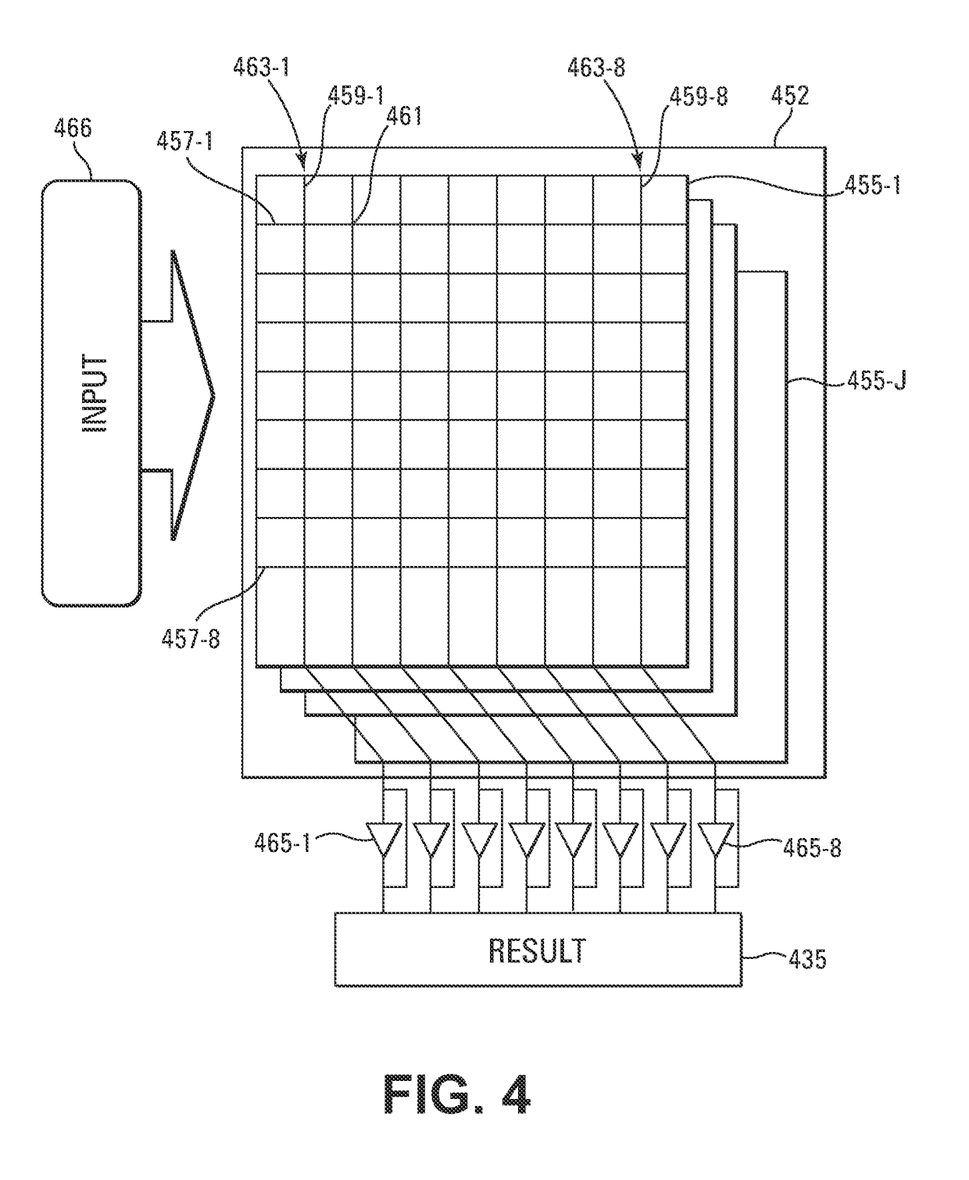
FIG. 4 illustrates a portion of a non-volatile content addressable memory in accordance with a number of embodiments of the present disclosure.

FIG. 4 illustrates a portion of a non-volatile CAM in accordance with a number of embodiments of the present disclosure. For example, FIG. 4 illustrates a portion, such as a tile 452, of a non-volatile CAM array of a main CAM. In some examples, the CAM array of each main CAM can have a number of memory tiles 452. Each memory tile 452 can have a quantity of data planes, such as data vector planes 455-1 to 455-J.

Each data vector plane 455 can have word lines 457-1 to 457-8. Each of the word lines 457-1 to 457-8 can cross bit lines 459-1 to 459-8. As such, data vector plane 455 can be a cross point data vector plane. There can be a memory cell 461, such as a resistance variable memory cell, at each crossing of a word line and a bit line. In some examples, a group of memory cells (e.g., a column of memory cells) commonly coupled to a bit line 459 can store a data vector. For example, the columns of memory cells respectively commonly coupled to bit lines 459-1 to 459-8 can respectively store data vectors 463-1 to 463-8. Although, eight bit lines and eight word lines are shown, there can be any number of bit lines and word lines.

The bit lines 459-1 to 459-8 in each vector plane 455 can be respectively coupled to sense amplifiers 465-1 to 465-8. Sense amplifiers 465-1 to 465-8 can respectively generate results of comparisons of an input data vector 466 to stored vectors 463-1 to 463-8. For example, the results can be components of a result vector 435 that can be result vector 335-Main. In some examples, the stored data vectors in a memory tile can be compared to input data vector 466 a plane at a time (e.g., on a plane by plane basis).

The location of a stored vector, in some examples, can be specified by specifying the location of a CAM in a CAM system, such as a CAM 106 in CAM system 102, a location of a memory tile in the CAM, a location of a vector plane in a memory tile, and the location of the stored data vector in the vector plane. For example, an address that specifies the location of a stored data vector can specify the location of the CAM in the CAM system, the location of the memory tile in the CAM, the location of the plane in the memory tile, and the location of the data vector in the vector plane.

Figure 5:
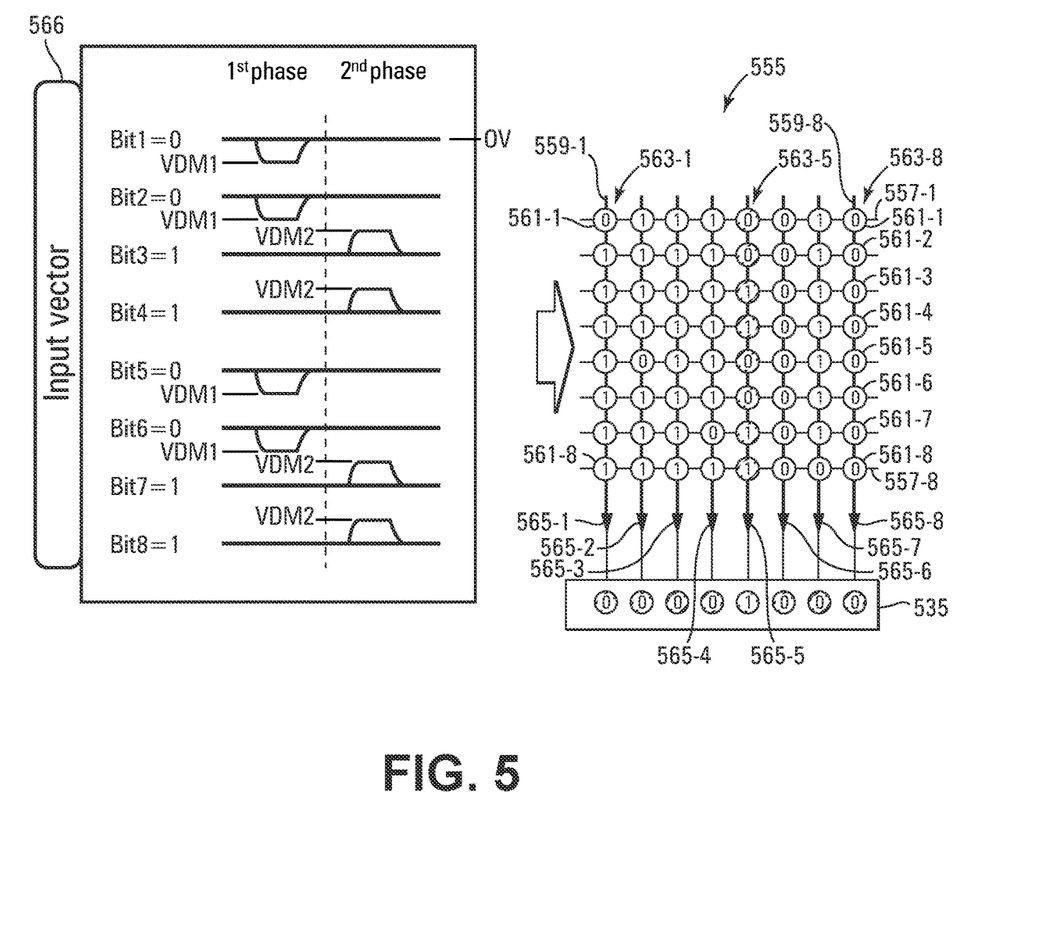
FIG. 5 illustrates an example of comparing input data to data stored in a non-volatile content addressable memory in accordance with a number of embodiments of the present disclosure.

FIG. 5 illustrates an example of comparing input data to data stored in a non-volatile CAM in accordance with a number of embodiments of the present disclosure. For example, in FIG. 5, an input data vector 566 is being compared to data vectors 563-1 to 563-8 in a vector plane 555 of a main CAM concurrently. Input data vector 566 can have, for example, component data (e.g., bit) values 00110011 respectively corresponding to bits Bit1 to Bit8.

Vector plane 555 can have word lines 557-1 to 557-8. Each of the word lines 557-1 to 557-8 can cross bit lines 559-1 to 559-8. There can be a memory cell 561, such as a resistance variable memory cell, at each crossing of a word line and a bit line. Although eight bit lines and eight word lines are shown in the example of FIG. 5, embodiments are not limited to a particular number of word lines and/or bit lines.

Data vectors 563-1 to 563-8 can be respectively stored in columns of memory cells respectively commonly coupled to bit lines 559-1 to 559-8. For example, memory cells 561-1 to 561-8 in each respective column can be respectively coupled to word lines 557-1 to 557-8. In this example, data vector 563-1 (01111111) is stored in cells coupled to bit line 559-1, data vector 563-2 (11110111) is stored in cells coupled to bit line 559-2, data vector 563-3 (11111111) is stored in cells coupled to bit line 559-3, data vector 563-4 (11111101) is stored in cells coupled to bit line 559-4, data vector 563-5 (00110011) is stored in cells coupled to bit line 559-5, data vector 563-6 (00000000) is stored in cells coupled to bit line 559-6, data vector 563-7 (11111110) is stored in cells coupled to bit line 559-7, and data vector 563-8 (00000000) is stored in cells coupled to bit line 559-8. Note that the respective data values (e.g., components) of each of respective data vectors 563-1 to 563-8 are respectively stored in memory cells 561-1 to 561-8

The bit lines 559-1 to 559-8 can be respectively coupled to sense amplifiers 565-1 to 565-8. Sense amplifiers 565-1 to 565-8 can respectively generate results of comparisons of input data vector 566 to stored vectors 563-1 to 563-8. For example, the results can be components of a result vector 535 that can be result vector 335-Main.

Bit1 to Bit8 of input data vector 566 can be respectively compared to the data respectively stored in the memory cells 561-1 to 561-8 coupled to each of data lines 559-1 to 559-8. A bit value of logical 0 can be compared to the data stored in a memory cell 561 by applying a voltage differential, such as a demarcation voltage VDM1, across the memory cell. A bit value of logical 1 can be compared to the data stored in a memory cell 561 by applying a demarcation voltage VDM2 across the memory cell.

For example, VDM1 can correspond to an input bit value of logical 0, and VDM2 can correspond to an input bit value of logical 1. In some examples, a demarcation voltage can be a voltage applied to a bit line coupled to the memory cell minus a voltage applied to a word line coupled to the memory cell. Note that in the present example, VDM1 and VDM2 have opposite polarities, with VDM1 having a negative polarity and VDM2 having a positive polarity. However, the present disclosure is not so limited.

In some examples, a memory cell 561 may experience a switching event, such as a thresholding event, (e.g., a snapback event) in response to applying VDM1 across the memory cell 561 or a switching event in response to applying VDM2 across the memory cell 561. For example, the memory cell 561 can switch from one conductivity state, such as a low conductivity state (e.g., high resistive state), to another conductivity state, such as a high conductivity state (e.g., a low resistive state).

In some examples, a memory cell experiencing a switching event in response to a demarcation voltage may be deemed as storing a data value that mismatches the input data value corresponding to the demarcation voltage. For example, a memory cell storing a logical 1 may experience a switching event in response applying VDM1 (e.g., corresponding to an input logical 0) across that memory cell, and a memory cell storing a logical 0 may experience a switching event in response applying VDM2 (e.g., corresponding to an input logical 1) across that memory cell.

In such an example, a memory cell not experiencing switching event in response to the demarcation voltage may be deemed as storing a data value that matches the input data value corresponding to the demarcation voltage. For example, a memory cell storing a logical 0 may not experience a switching event in response applying VDM1 across that memory cell, and a memory cell storing a logical 1 may not experience a switching event in response applying VDM2 across that memory cell. Note, however, that in other examples, a switching event can be indicative of a match and no switching event can be indicative of a mismatch.

Note that if the data stored in least one of the memory cells of a data vector 563 mismatches the corresponding bit of the input data vector 566, then the data vector 563 can mismatch input data vector 566. A sense amplifier 565 may sense a switching event experienced by one or more memory cells in a corresponding data vector 563 by sensing a change in current that may be reflected in the output voltage of the sense amplifier. As a result, the sense amplifier can sense a mismatch between the data vector coupled to the sense amplifier and input data vector 566 by sensing a switching event. For example, the sense amplifier might generate (e.g., output) a logical 0, in response to sensing a switching event, to indicate a mismatch between the data vector coupled to the sense amplifier and input data vector 566. The sense amplifier might generate a logical 1, in response to not sensing a switching event, to indicate a match between the data vector coupled to the sense amplifier and input data vector 566.

In some examples, a portion of the input data vector 566 can be compared to corresponding portions of the data vectors 563-1 to 563-8 during a first time period corresponding to a first phase of the comparison, and a remaining portion of the input data vector 566 can be compared to corresponding portions of the data vectors 563-1 to 563-8 during a second time period corresponding to a second phase of the comparison. During the first phase, the bits Bit1, Bit2, Bit5, and Bit6 of input data vector 566 having logical 0s can be respectively compared to the data values stored in the memory cells 561-1, 561-2, 561-5, and 561-6 of each of data vectors 563-1 to 563-8 by applying VDM1 across those memory cells while zero volts, for example, is applied across remaining memory cells 561-3, 561-4, 561-7, and 561-8. During the second phase, the bits Bit3, Bit4, Bit7, and Bit8 of input data vector 566 having logical 1s can be respectively compared to the data values stored in the memory cells 561-3, 561-4, 561-7, and 561-8 of each of data vectors 563-1 to 563-8 by applying VDM2 across those memory cells while zero volts, for example, is applied across remaining memory cells 561-1, 561-2, 561-5 and 561-6. However, the present disclosure is not so limited, and VDM1 and VBM2 can be applied concurrently (e.g., during the same phase).

The CAM arrays of the main CAMs can include two-dimensional (2D) and/or three-dimensional (3D) array structures, such as cross point array structures. The memory cells (e.g., memory cells 461 and 561) can include, for example, various types of resistance variable storage elements and/or switch elements. For example, the cells can be phase change random access memory (PCRAM) cells or resistive random access memory (RRAM) cells.

As used herein, a storage element refers to a programmable portion of a memory cell. For instance, the main CAMs can be 3D cross point devices whose cells can include a "stack" structure in which a storage element is coupled in series with a switch element and which can be referred to herein as a 3D phase change material and switch (PCMS) device. 3D PCMS cells can include, for example, a two-terminal chalcogenide-based storage element coupled in series with a two-terminal chalcogenide-based switch element, such as an ovonic threshold switch (OTS). In some examples, the memory cells can be self-selecting memory (SSM) cells in which a single material can serve as both the switch element and the storage element. An SSM cell can include a chalcogenide alloy; however, embodiments are not so limited.

As non-limiting examples, the memory cells of the disclosed non-volatile CAMs can include a phase change material (e.g., phase change chalcogenide alloy) such as an indium (In)-antimony (Sb)-tellurium (Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other memory cell materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

In the preceding detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" or a "quantity of" something can refer to one or more of such things. For example, a number of or a quantity of memory cells can refer to one or more memory cells. A "plurality" of something intends two or more. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). As used herein, multiple acts being performed concurrently refers to acts overlapping, at least in part, over a particular time period.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a controller;
   a first content addressable memory coupled to the controller; and
   a second content addressable memory coupled to the controller;
   wherein the controller is configured to:
      determine whether first data stored in the first content addressable memory is invalid for comparison to input data by determining whether an elapsed time from a time when the first data is written to the first content addressable memory to a time when the input data is compared to the first data is less than a threshold length of time; and wherein the first data is concurrently written to the first content addressable memory and to the second content addressable memory such that the time when the first data is written to the first content addressable memory is the time when the first data is written to the second content addressable memory.

2. The apparatus of claim 1, wherein the threshold length of time is an elapsed time from the time when the first data is written to a memory cell of the first content addressable memory to a length of time corresponding to an amount of drift for the memory cell.

3. The apparatus of claim 2, wherein the amount of drift corresponds to an expansion of a window, between a first edge voltage of a first threshold voltage distribution corresponding to a first state for the memory cell and a second edge voltage of a second threshold voltage distribution corresponding to a second state for the memory cell, to include a demarcation voltage to be applied to the memory cell.

4. The apparatus of claim 1, wherein the second content addressable memory comprises volatile memory cells and the first content addressable memory comprises non-volatile memory cells.

5. The apparatus of claim 1, wherein the controller is configured to store a mapping that maps a location in the first content addressable memory where the first data is stored to a location in the second content addressable memory where the second data is stored, wherein the mapping indicates the time when the first data is written to the first content addressable memory.

6. The apparatus of claim 1, wherein the controller is configured to replace a first result of a comparison of the input data to the first data with a second result of a comparison of the input data to the second data stored in the second content addressable memory in response to determining that the first data is invalid.

7. The apparatus of claim 6, wherein the controller includes match validation circuitry to:
read the first data stored in the first content addressable memory and perform the comparison with the input data to generate the first result indicating whether there is a match between the first data and the input data; and
read the second data stored in the second content addressable memory and perform the comparison with the input data to generate the second result indicating whether there is a match between the second data and the input data.

8. The apparatus of claim 6, wherein the first content addressable memory includes match validation circuitry to:
read the first data stored in the first content addressable memory and perform the comparison with the input data to generate the first result indicating whether there is a match between the first data and the input data; and
provide the first result responsive to a determination that the first data is valid.

9. The apparatus of claim 8, wherein the first result was a match between the first data and the input data, and wherein the validation circuitry is configured to:
validate the first result by rereading the first data stored in the first content addressable memory and reperforming the comparison with the input data to generate a second result indicating whether there is a match between the first data and the input data; and increase the threshold length of time responsive to a determination that the second result was a mismatch between the first data and the input data.

10. An apparatus, comprising:
a controller;
a main content addressable memory coupled to the controller; and
a buffer content addressable memory coupled to the controller;
wherein the controller is configured to:
manage a data structure comprising an entry that comprises a mapping between a location of data stored in the main content addressable memory for comparison to input data and a location of corresponding data stored in the buffer content addressable memory; and
write, in the entry, a timestamp indicative of the validity of the data stored in the main content addressable memory; wherein the timestamp corresponds to a time at which the data stored at the location in the main content addressable memory and the data stored at the location in the buffer content addressable memory were concurrently written.

11. The apparatus of claim 10, wherein the controller is configured to:
cause the main content addressable memory to compare the input data to the data stored in the main content addressable memory to generate a first comparison result;
cause the buffer content addressable memory to compare the input data to the data stored in the buffer content addressable memory to generate a second comparison result; and
determine whether the first comparison result is valid based on a comparison of an elapsed time from the timestamp to a threshold length of time.

12. The apparatus of claim 10, wherein the timestamp corresponds to a time at which the data stored at the location in the main content addressable memory becomes valid.

13. The apparatus of claim 10, wherein the controller is configured to remove the entry from the data structure responsive to a determination that the data stored at the location in the main content addressable memory is valid.

14. The apparatus of claim 10, wherein the buffer content addressable memory is sized to store only a quantity of data that can be written to the main content addressable memory within a threshold amount of time that newly written data remains invalid in the main content addressable memory.

15. A method, comprising:
maintaining a data structure listing locations of invalid data stored in a main content addressable memory mapped to corresponding locations of data stored in a buffer content addressable memory, wherein to maintain the data structure includes maintaining an entry for a first location of first data written to the main content addressable memory mapped to a second location of the first data written to the buffer content addressable memory until a threshold amount of time has elapsed from a time when the first data is written to the main content addressable memory; and
utilizing the data structure to determine whether to substitute a result of a comparison of the second location of the first data written to the buffer content addressable memory to input data for a result of a comparison of the first location of the first data written to the main content addressable memory to the input data; and wherein the first data is written concurrently to the first location in the main content addressable memory and to the second location in the buffer content addressable memory.

16. The method of claim 15, further comprising utilizing a timestamp included in the entry for the first location of the first data written to the main content addressable memory to determine whether the threshold amount of time has elapsed from the time when the first data was written to the main content addressable memory.

17. The method of claim 15, further comprising:
limiting a size of the data structure to an amount of entries corresponding to an amount of data that can be written to the main content addressable memory within a threshold amount of time that newly written data remains invalid in the main content addressable memory; and
substituting a result of a comparison of the second location of the first data written to the buffer content addressable memory to input data for a result of a comparison of the first location of the first data written to the main content addressable memory to the input data based on the presence of the entry in the data structure.

18. The method of claim 15, further comprising:
limiting a size of the data structure to an amount of entries corresponding to an amount of data that can be written to the main content addressable memory within a threshold amount of time that newly written data remains invalid in the main content addressable memory; and
overwriting an oldest entry in the data structure with a newest entry.

* * * * *